(12) United States Patent
Tran et al.

(10) Patent No.: US 11,368,155 B1
(45) Date of Patent: Jun. 21, 2022

(54) LOW POWER POWER-UP RESET OUTPUT DRIVER

(71) Applicant: GLOBALFOUNDRIES U.S. Inc., Santa Clara, CA (US)

(72) Inventors: Dzung T. Tran, Austin, TX (US); Shibly S. Ahmed, San Jose, CA (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/112,456

(22) Filed: Dec. 4, 2020

(51) Int. Cl.
| | |
|---|---|
| *H03K 19/0175* | (2006.01) |
| *H03K 19/0185* | (2006.01) |
| *H03K 19/20* | (2006.01) |
| *H03K 19/003* | (2006.01) |

(52) U.S. Cl.
CPC ... *H03K 19/018521* (2013.01); *H03K 19/003* (2013.01); *H03K 19/0175* (2013.01); *H03K 19/20* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,985,022 B2 * | 1/2006 | Kanno | ............ | H03K 3/356113 327/333 |
| 7,456,663 B2 * | 11/2008 | Lim | ................... | H03K 19/0016 327/112 |
| 10,637,463 B2 | 4/2020 | Wang | | |
| 10,686,438 B2 | 6/2020 | Yu et al. | | |
| 2004/0257142 A1 * | 12/2004 | Kanno | .......... | H03K 19/018521 327/333 |

* cited by examiner

*Primary Examiner* — Long Nguyen
(74) *Attorney, Agent, or Firm* — Hoffman Warnick LLC (57) ABSTRACT

Embodiments of the disclosure provide an input output (IO) structure in which complimentary nodes of a level shifter are utilized to logically block the output of the IO structure from switching until both power supplies to the IO structure are powered up. An illustrative level shifter includes: a cross-coupled pair of PFETs configured to output complimentary voltage values at a first node and a second node; a control circuit configured to select which of the complementary voltage values are output to the first node and second node; a logic inverter having an input coupled to the first node and an output coupled to a third node; and a NAND gate having inputs coupled to the second node and third node and that generates a level shifted output.

15 Claims, 7 Drawing Sheets

LOW POWER POWER-UP RESET OUTPUT DRIVER

TECHNICAL FIELD

Embodiments of the disclosure relate generally to electronic circuits. More specifically, various embodiments of the disclosure provide a circuit structure for an output driver of a general purpose input output (GPIO) having multiple voltage domains that can power up in any order.

BACKGROUND

A general purpose input output (GPIO) generally refers to a circuit and signal pin (or pad) on an integrated circuit (IC) that can act as an input or an output. A GPIO usually has two voltage domains requiring two power supplies, a core voltage domain, e.g., of 0.8 volts (V) for driving core transistors, and a higher output voltage domain, e.g., of 1.8 V for driving input/output (IO) transistors. During runtime, a control circuit determines which domain to use, and interfaces with a level-up voltage shifter to implement to a transition from the low voltage domain to the high voltage domain, and a level-down voltage shifter to implement a transition from the high voltage domain to the low voltage domain.

During a system reset, the core voltage power supply must typically be powered up first, then the high voltage power supply, in order to avoid the case where, e.g., the level-up shifter output powers-up in a wrong state and inadvertently turns on the main driver. To overcome this and allow the high voltage power supply to be turned on first, additional circuitry such as a power-on-control (POC) mechanism can be utilized to keep the level-shifter output at a preferred known state. This approach however requires an additional control input and an additional power-up detect circuit within the IC, which adds complexity, cost and the potential for leakage current.

SUMMARY

Aspects of the present disclosure provide a level-up shifter configured to shift an output node from a low voltage value (VDD_L) to a high voltage value (VDD_H), the level-up shifter including: a first input for receiving VDD_H and a second input for receiving VDD_L; a cross-coupled pair of PFETs configured to output complimentary voltage values at a first node and second node, wherein the complimentary voltage values include ground and VDD_H; a control circuit coupled to the cross-coupled pair of PFETs and configured to select which of the complementary voltage values are output to the first node and second node; and protection logic, wherein the protection logic is configured to block the output node from switching states during a power-up phase in response to a detectable voltage on both the first node and second node.

Further aspects of the present disclosure provide a general purpose input output (GPIO), including: a pad; and an output driver having at least one level-up shifter to shift a voltage at the pad from a low voltage value (VDD_L) to a high voltage value (VDD_H), wherein the level-up shifter includes: a first input for receiving VDD_H and a second input for receiving VDD_L; a cross-coupled pair of PFETs configured to output complimentary voltage values at a first node and second node, wherein the complimentary voltage values include ground and VDD_H; a control circuit coupled to the cross-coupled pair of PFETs and configured to select which of the complementary voltage values are output to the first node and second node; and protection logic, wherein the protection logic is configured to block the output node from switching states during a power-up phase in response to a detectable voltage on both the first node and second node.

BRIEF DESCRIPTION OF THE DRAWINGS

These and other features of this disclosure will be more readily understood from the detailed description of the various aspects of the disclosure taken in conjunction with the accompanying drawings that depict various embodiments of the disclosure, in which.

It is noted that the drawings of the disclosure are not necessarily to scale. The drawings are intended to depict typical aspects of the disclosure, and therefore should not be considered as limiting the scope of the disclosure. In the drawings, like numbering represents like elements between the drawings.

DETAILED DESCRIPTION

In the description herein, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made within the scope of the present teachings. The description herein is, therefore, merely illustrative.

Embodiments of the disclosure provide a circuit and related method for a general purpose input output (GPIO) having a low and high voltage domain, in which any power up sequence can be utilized for the two voltage domains. The examples provided herein are described using voltage domains of 0.8 volts (V) and 1.8 V, however is understood that other voltage levels could be utilized. The GPIO described herein includes a level-up shifter with designed-in protection logic that ensures the main driver behaves properly during power-up, regardless of which power supply is turned on first. The described level-up shifter does not require additional control inputs or power up detect circuits in the core or input/output (IO) ring area. Instead, an internal power up voltage detector (referred to herein as "protection logic") within the level shifter pulls the level shifter to a known preferred state, thus tri-stating the GPIO during power up. In one illustrative embodiment, the complimentary nodes of the level shifter are utilized as input to the protection logic to logically block the level-shifted output from switching until both power supplies to the IO structure are powered up.

Figure 1:
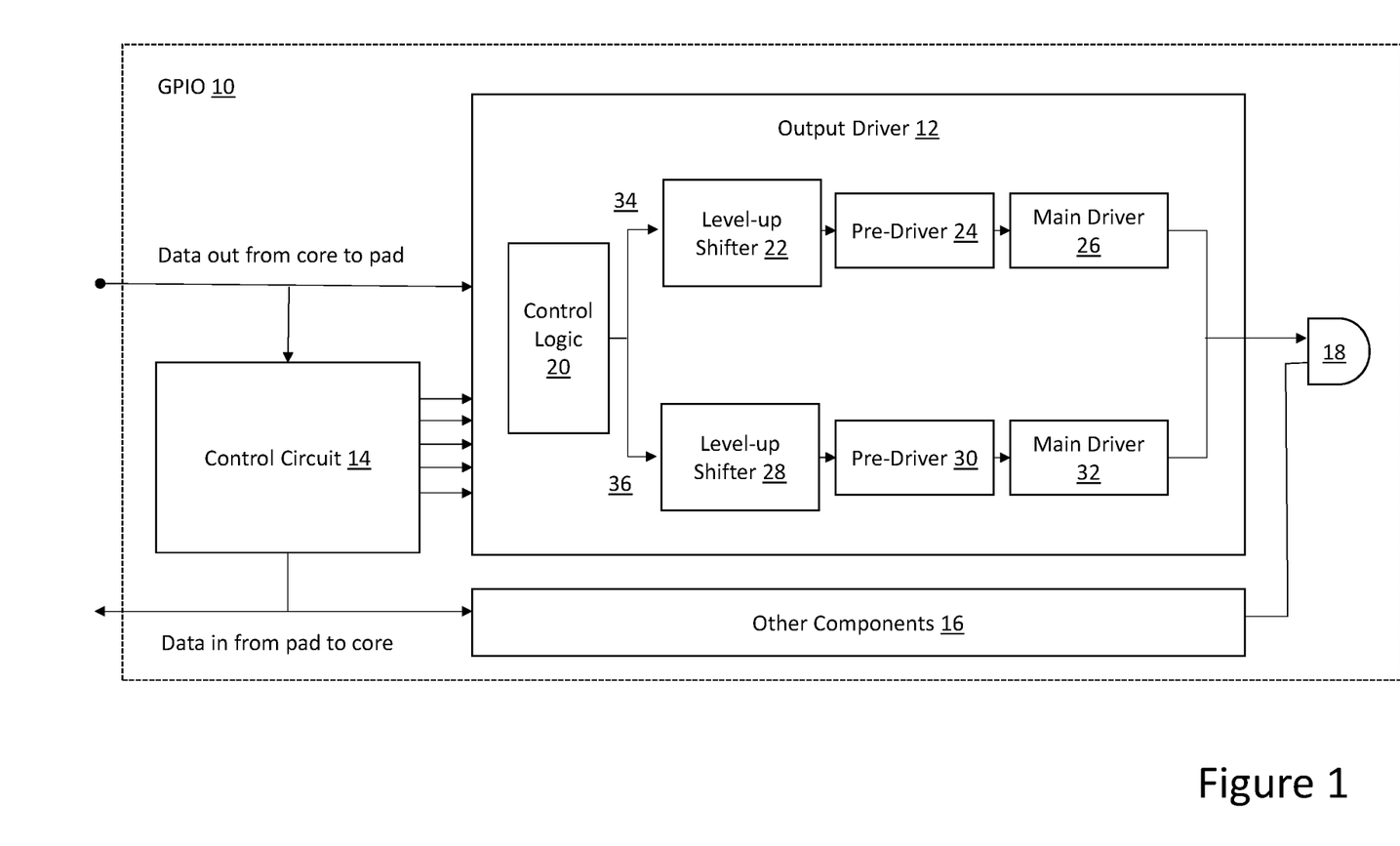
FIG. 1 provides a block diagram of a GPIO according to embodiments of the disclosure.

Referring to FIG. 1, a simplified block diagram of an illustrative GPIO 10 is shown. GPIO 10 may be embodied as any type of electronic circuit and in various implementations may be provided in the form of, or included as part of, an integrated circuit (IC) structure. GPIO 10 generally includes a control circuit 14, an output driver 12 and a pad 18. GPIO 10 would typically include other components 16, such as an input driver, electrostatic discharge elements, data lines, control lines, etc., which have been omitted for brevity. In this illustrative embodiment, output driver 12 is utilized to drive the pad 18 to a high voltage domain (e.g., 1.8 V) using level-up shifters 22, 28.

In this embodiment, two output paths are implemented, one for PMOS pull-up 34 and one for NMOS pull-down 36. These two separate paths allow better timing control and provide the ability to turn off the pull-up path 34 during open-drain operations. However, it is understood that GPIO 10 could be implemented with a single path. As data is being outputted from the core to the pad 18 during normal operations, control logic 20 controls each path. In addition to control logic 20, each path 34, 36 also includes a pre-driver 24, 30 and a main driver 26, 32, respectively. To perform level-up shifting, each level shifter 22, 28 includes a power supply from both voltage domains. As noted, in prior designs, level shifters might inadvertently cause main driver 26, 32 to be driven to an unwanted state during power up if the higher power supply was turned on before the lower power supply. The present approach overcomes this issue with an improved level shifter design.

Figure 2:
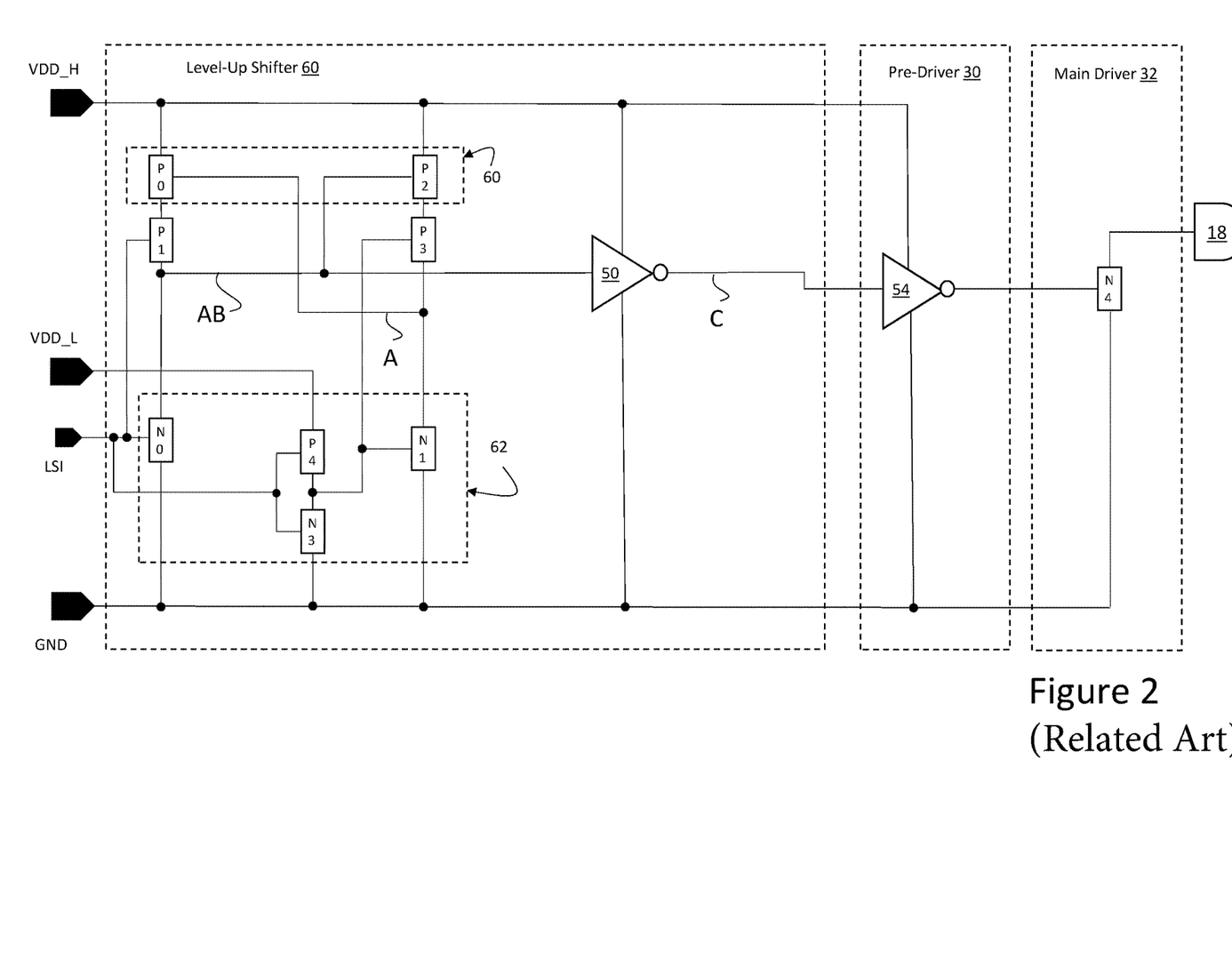
FIG. 2 shows a schematic view of an illustrative pull-down output driver having a level-up shifter.

FIG. 2 depicts the circuit design of a conventional level-up shifter 60 configured for pull down path 36 (FIG. 1). In the example shown, the main driver 32 includes an NFET driver N4, whereas in the pull-up path 34 the main driver 26 would include a PFET (see FIG. 3). Level-up shifter 60 is coupled to both a high domain power supply VDD_H (e.g., 1.8 V) and low domain power supply VDD_L (e.g., 0.8 V). Level-up shifter 60 generally includes a crossed coupled set of PFETs 60 (P0 and P2) that generate complimentary outputs, e.g., 0 V and 1.8 V, on nodes A and AB, and a control circuit 62 coupled to VDD_L that determines whether nodes A and AB should output 0V and 1.8V or 1.8V and 0V, respectively, based on level shifter input (LSI).

Control circuit includes a CMOS inverter (P4 and N3) supplied by VDD_L, as well as NFETs N0 and N1. N0 connects node AB to ground and is gated by LSI. N1 connects node A to ground and is gated by the output of the CMOS inverter. Additional PFETs P1 and P3 are included to increase operational performance of the circuit, but could be omitted. During normal operations, when LSI is low, e.g., 0 V, N0 is off and N1 is on, so node A is 0 V and node AB is 1.8 V. The signal on node AB is then inverted to 0 by inverter 50 and outputted to the pre-driver 30, which inverts and outputs a 1.8 V signal to main driver 32. When LSI is high, e.g., 0.8 V, N0 is on, node AB is pulled to 0V and node A goes to 1.8 V. That results in an output signal of 0 to the main driver 32.

As noted, conventional implementations of level shifter 60 may have unwanted behaviors during power-up. In the case where VDD_H is turned on first at power-up, VDD_H ramps from 0 V to 1.8 V while VDD_L is still at the 0 V level. Both N0 and N1 are off and nodes A and AB begin pulling up to a detectable voltage of approximately VDD_H-Vtp (where Vtp is the threshold voltage of P0 or P1). This causes inverter 50 to output a 0 V at node C. This turns on the output of the pre-driver 30 and turns on main driver NFET N4, which, e.g., can cause undesired leakage current from pad 18 to ground (GRD).

Figure 3:
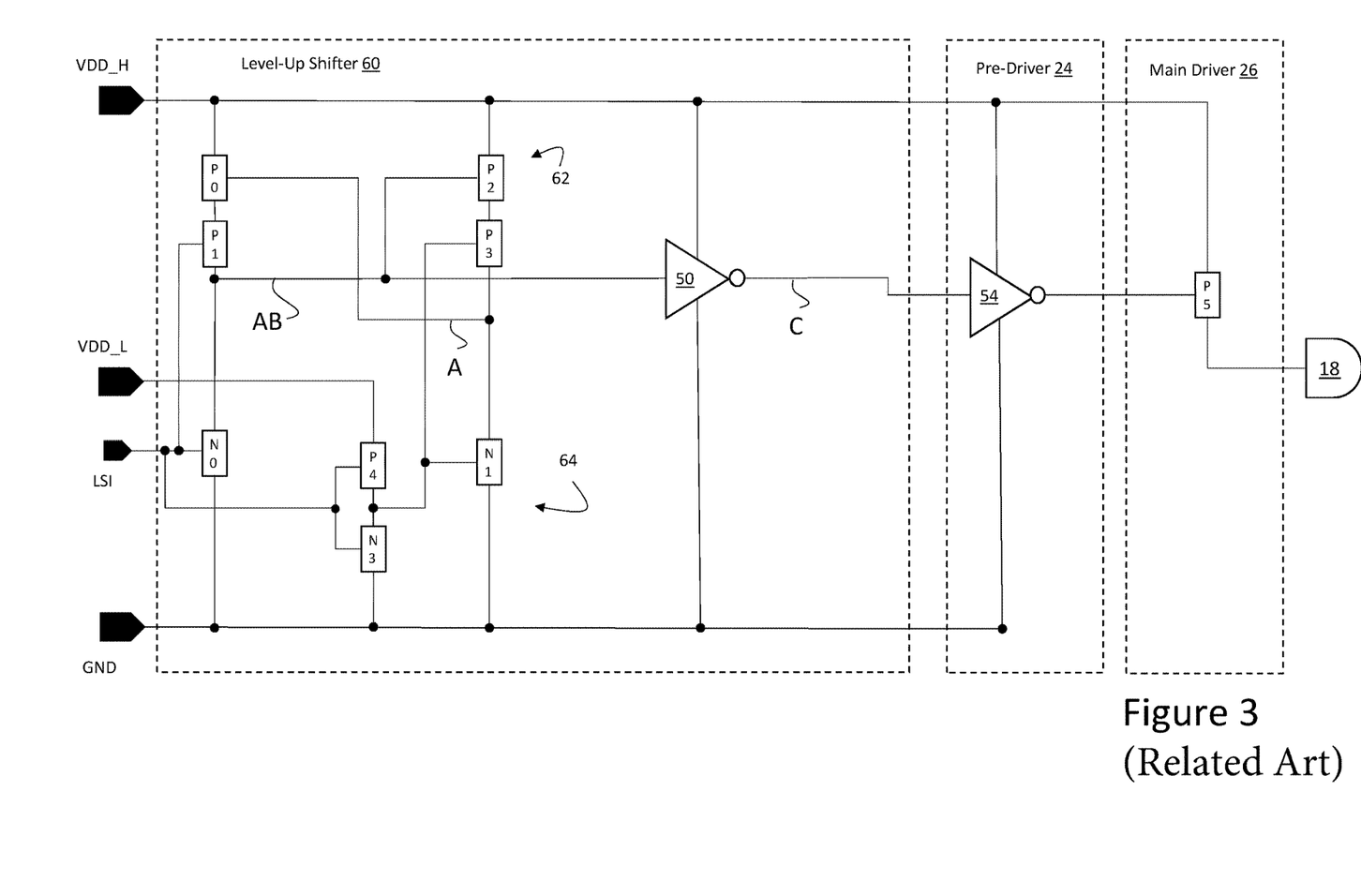
FIG. 3 shows a schematic view of an illustrative pull-up output driver having a level-up shifter.

FIG. 3 depicts the same prior art level-up shifter 60 for the pull-up path 34 (FIG. 1). In this case, main driver 26 includes a PFET (P5) coupled to VDD_H.

Figure 4:
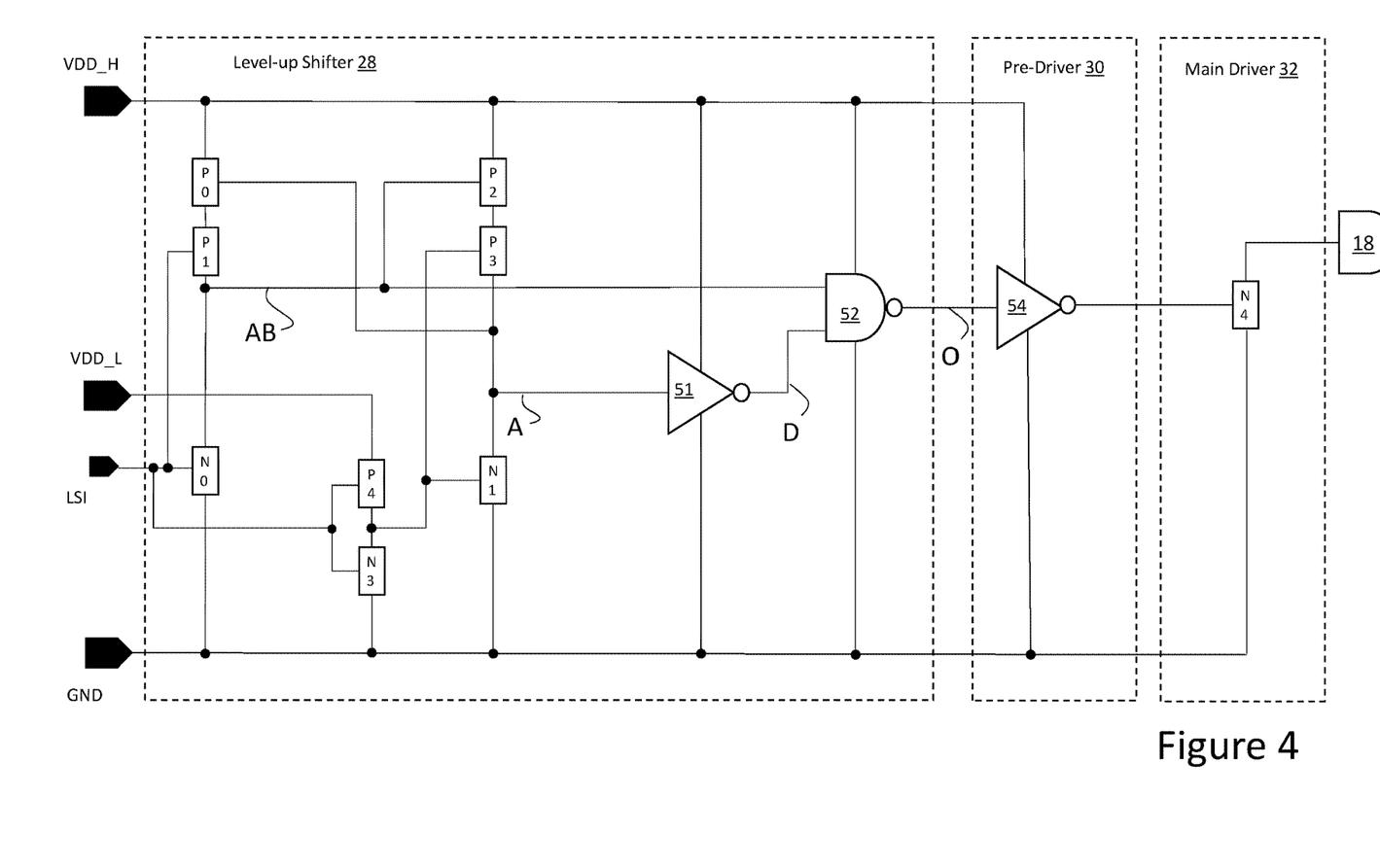
FIG. 4 shows a schematic view of an improved pull-down output driver having a level-up shifter according to embodiments of the disclosure.

FIG. 4 depicts an illustrative embodiment of an improved level-up shifter 28 in which inverter 50 (FIGS. 2 and 3) is replaced by protection logic to prevent the above described issue, in this case inverter 51 and NAND gate 52. In this embodiment, NAND gate 52 receives a first input from node AB and a second input from inverter 51 (i.e., the inverted signal of node A). During normal operations the circuit behaves the same as the prior art circuits, e.g., when AB is 1.8 V and A is 0 V, node D is 1.8 V and the output O is 0 V. Conversely, when AB is 0 V and A is 1.8 V, node D is 0 V and output O is 1.8 V.

During power-up operations, when VDD_H is ramping up from 0 V to 1.8 V, and VDD_L is still at 0 V level, transistors N0 and N1 are both off. This results in nodes A and AB pulling up to a detectable voltage of approximately VDDO-Vtp. In this case, however, node A, at logic high, switches node D to low, and in turn pulls the level-shifted output O of NAND gate 52 to high. In response to the logic high input, inverter 54 in pre-driver 30 will output a logic low. This result turns off the main driver NFET N4, and keeps the output driver in the tri-state mode.

Figure 5:
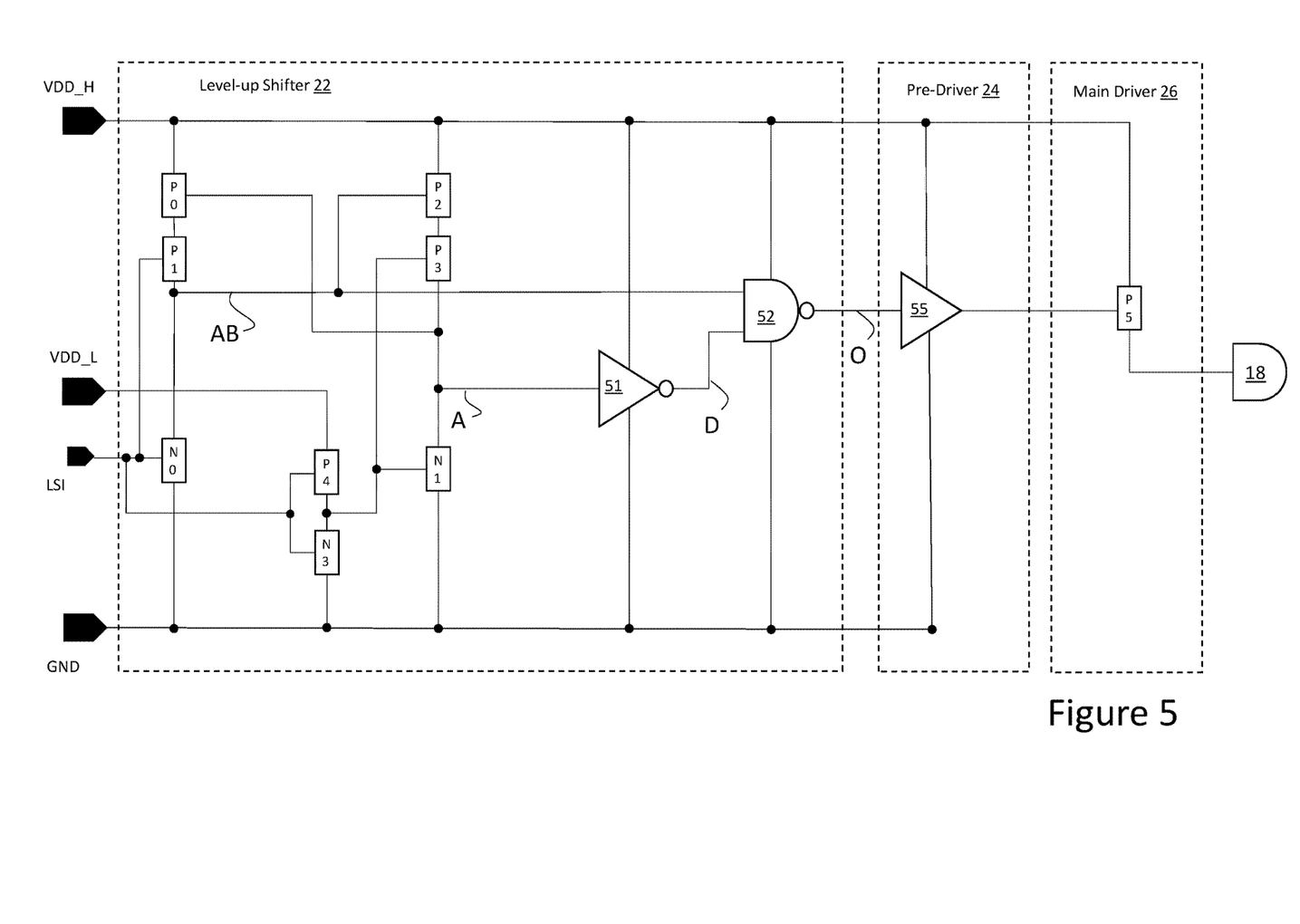
FIG. 5 shows a schematic view of an improved pull-up output driver having a level-up shifter according to embodiments of the disclosure.

FIG. 5 depicts the similar circuit with the improved level-up shifter 22 for the pull-up path 34 (FIG. 1). In this case, pre-driver 24 includes buffer 55, and main driver 26 includes a PFET (P5) coupled to VDD_H.

Figure 6:
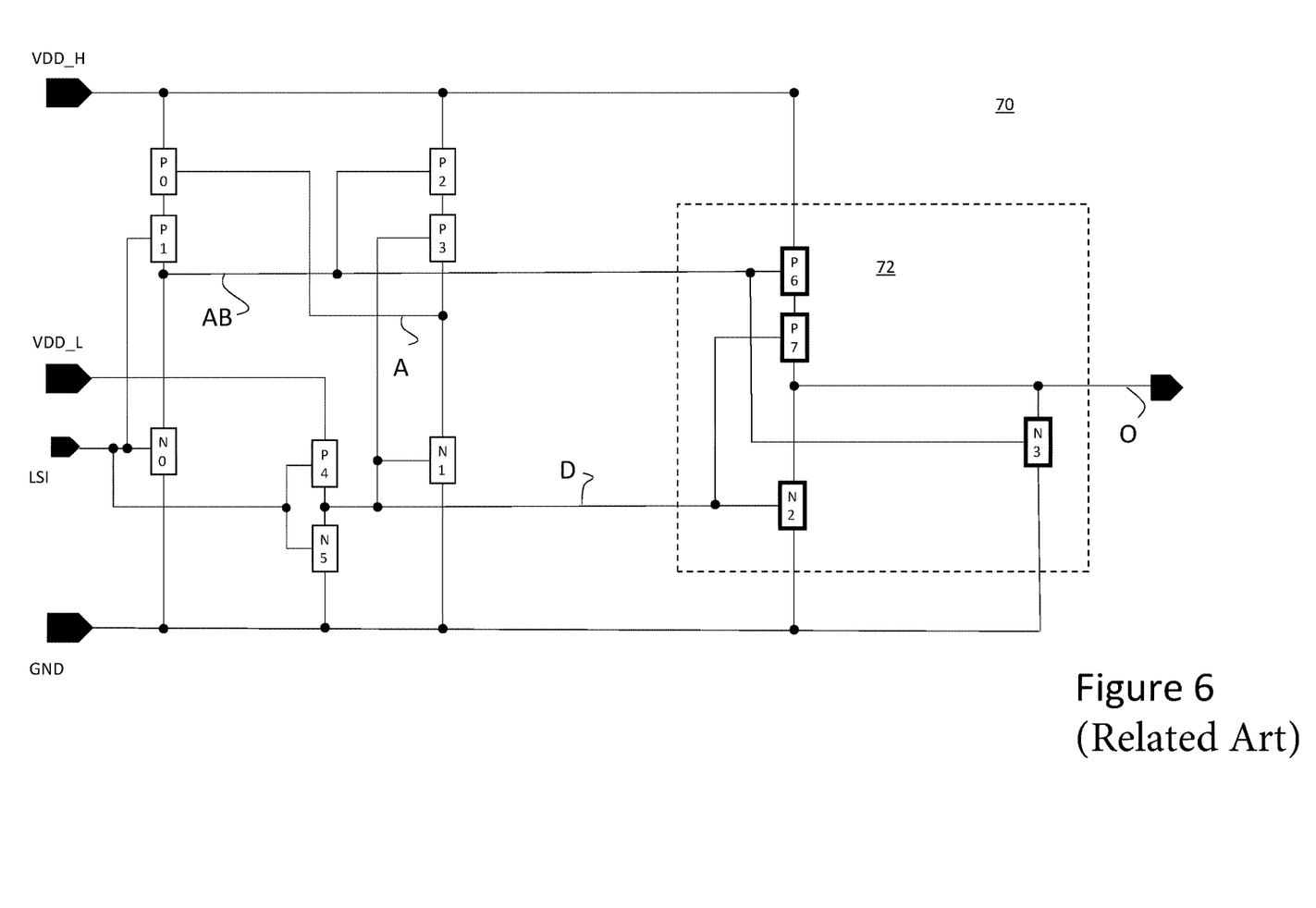
FIG. 6 depicts a schematic view of an alternative level-up shifter.

FIG. 6 depicts an alternative form of a conventional level-up shifter 70. In this circuit, rather than utilizing an inverter (such as inverter 50 in FIG. 2), a NOR gate 72 is utilized to generate level-shifted output O. This configuration reduces the logic conversion from low to high and high to low to just two inversions, instead of four inversions as used in the previous prior art level shifter 60 (FIGS. 2 and 3). The power-up issue is however the same as with the previous implementation. When VDD_H is powered-up first, both nodes AB and A float to logic high. Node D is at logic low because VDD_L is low. P6 is off and P7 is turned on, N2 is off, and N3 is on pulling level-shifted output O to logic low (i.e., ground).

Figure 7:
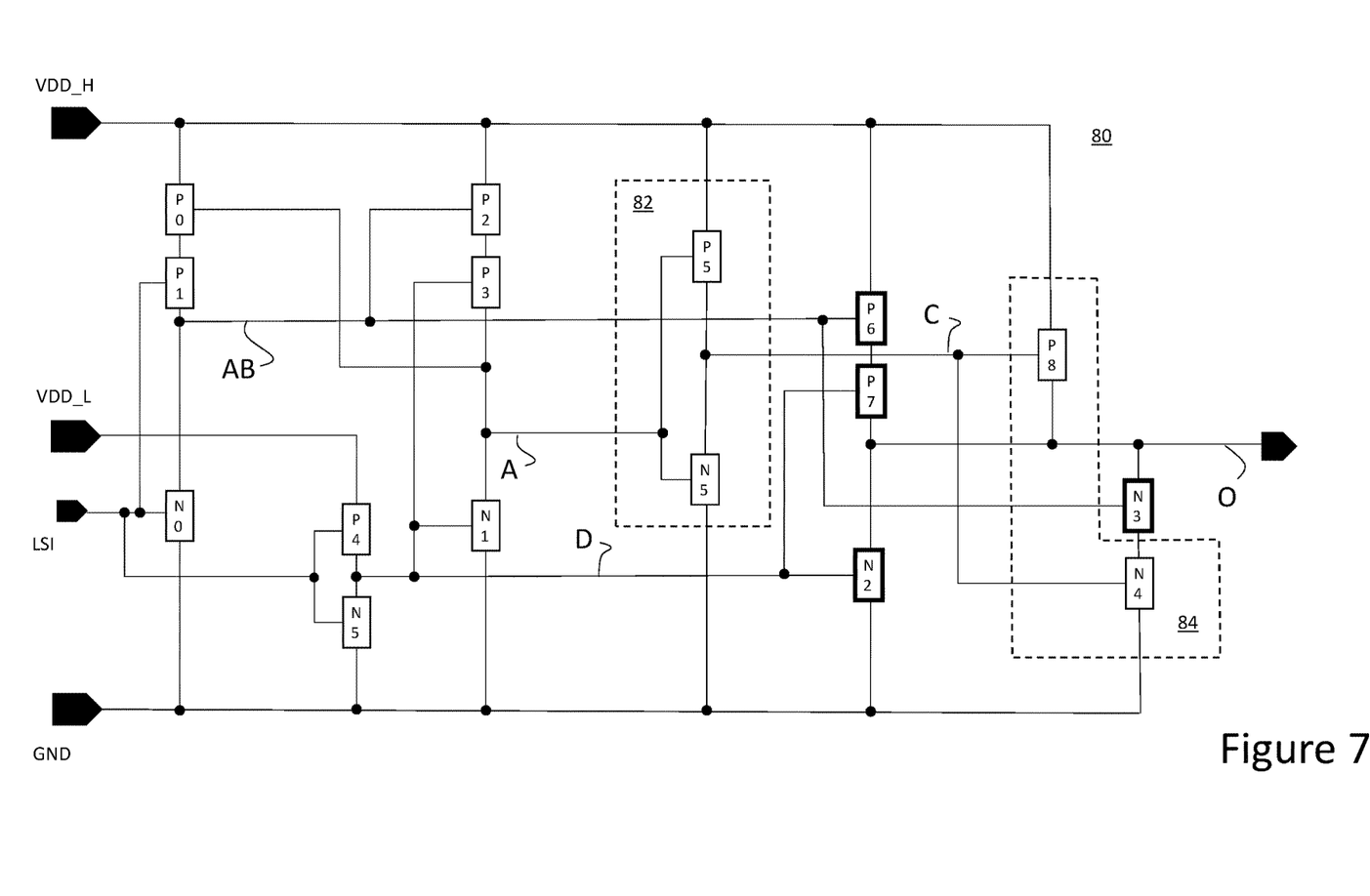
FIG. 7 depicts a schematic view of an improved alternative level-up shifter according to embodiments of the disclosure.

FIG. 7 depicts an improved level-up shifter 80 for the circuit of FIG. 6. In this case, protection logic is added that includes a second CMOS inverter 82 and NAND function 84 (rather than a full NAND gate). Inverter 82 is supplied by VDD_H and is gated by node A. NAND function 84 includes an additional PFET P8 that connects VDD_H to the level-shifted output O and is gated by the inverter 82. Function 84 also includes an additional NFET N4 that connects the NOR gate to ground via NFET N3 and is likewise gated by the output of inverter 82.

At power up, when AB and A are both floating to logic high, and D is at logic low, P6 is off, P7 is on, N2 is off, and N3 is on. However, N4 is now off and P8 is on because node C is low after the inverter, pulling output O to logic high. This ensures that the NFET driver (not shown) is turned off during power-up.

In the improved level-up shifter designs, the level shifted output will follow VDD_H during both power up and power down operations (regardless of sequence) to turn off the main driver.

The descriptions of the various embodiments of the present disclosure have been presented for purposes of illustration, but are not intended to be exhaustive and/or limited to the embodiments disclosed. Many modifications and variations will be apparent to those of ordinary skill in the art within the scope and spirit of the described embodiments. The terminology used herein was chosen to best explain the principles of the embodiments, the practical application and/or technical improvement over technologies found in the marketplace, and/or to enable others of ordinary skill in the art to understand the embodiments disclosed herein.

What is claimed is:

1. A general purpose input output (GPIO), comprising:
an output node; and
an output driver having at least one level-up shifter to shift a voltage at the output node from a first voltage value at the output node to a high voltage value (VDD_H) at the output node, wherein the level-up shifter includes:
  a first input for receiving VDD_H and a second input for receiving a low voltage value (VDD_L);
  a cross-coupled pair of PFETs configured to output complimentary voltage values at a first node and second node, wherein the complimentary voltage values include the first voltage value and VDD_H;
  a control circuit coupled to the cross-coupled pair of PFETs and configured to select which of the complementary voltage values are output to the first node and second node; and
  protection logic, wherein the protection logic is configured to block the output node from switching states during a power-up phase in response to a detectable voltage on both the first node and second node, wherein the protection logic includes:
    a logic inverter having an input coupled to the first node and an output coupled to a third node; and
    a NAND gate that generates a level shifted output, wherein the NAND gate includes a first input coupled to the second node and a second input coupled to the third node.

2. The GPIO of claim 1, wherein the output driver further includes a pre-driver and a main driver, wherein the main driver includes one of a NFET driver or a PFET driver.

3. The GPIO of claim 1, wherein the at least one level-up shifter of the output driver includes a first level-up shifter for controlling a PMOS pull-up transistor and a second level shifter for controlling an NMOS pull-down transistor.

4. The GPIO of claim 1, wherein the control circuit includes a CMOS inverter supplied by VDD_L and has an output coupled to a gate of an NFET that connects the first node to the first voltage value.

5. A level-up shifter configured to shift an output node from a first voltage value at the output node to a high voltage value (VDD_H) at the output node, the level-up shifter comprising:
a first input for receiving VDD_H and a second input for receiving a low voltage value (VDD_L);
a cross-coupled pair of PFETs configured to output complimentary voltage values at a first node and second node, wherein the complimentary voltage values include the first voltage value and VDD_H;
a control circuit coupled to the cross-coupled pair of PFETs and configured to select which of the complementary voltage values are output to the first node and second node; and
protection logic, wherein the protection logic is configured to block the output node from switching states during a power-up phase in response to a detectable voltage on both the first node and second node, wherein the protection logic includes:
  a CMOS inverter supplied by VDD_H having an input coupled to the first node; and
  a NAND function that includes:
    an additional PFET that connects VDD_H to the output node and has a gate coupled to an output of the CMOS inverter; and
    an additional NFET that connects a NOR gate to the first voltage value and has a gate coupled to the output of the CMOS inverter.

6. The level-up shifter of claim 5, wherein the power-up phase includes powering VDD_H prior to VDD_L.

7. The level-up shifter of claim 5, wherein the cross-coupled pair of PFETs are each coupled to VDD_H.

8. The level-up shifter of claim 5, wherein the control circuit includes a second CMOS inverter supplied by VDD_L and has an output coupled to a gate of an NFET that connects the first node to the first voltage value.

9. The level-up shifter of claim 8, wherein the NOR gate includes an input coupled to an output of the second CMOS inverter of the control circuit and an input coupled to the second node.

10. The level-up shifter of claim 8, wherein the control circuit receives a level shift input (LSI) coupled to an input of the second CMOS inverter and to a gate of a second NFET that connects the second node to the first voltage value.

11. The level-up shifter of claim 10, wherein each of the cross-coupled pair of PFETs is coupled to an additional PFET.

12. The level-up shifter of claim 10, wherein the LSI is further coupled to a gate of a first one of the additional PFETS.

13. The level-up shifter of claim 12, wherein the output of the second CMOS inverter is further coupled to a gate of a second one of the additional PFETs.

14. The level-up shifter of claim 5, wherein VDD_L is 0.8 volts and VDD_H is 1.8 volts.

15. The level-up shifter of claim 5, wherein the output node is either at the first voltage value or at VDD_H.

* * * * *